(12) United States Patent
McDonnell et al.

(10) Patent No.: US 10,443,903 B2
(45) Date of Patent: *Oct. 15, 2019

(54) EVAPORATIVE FLUID COOLING APPARATUSES AND METHODS THEREOF

(71) Applicants: Gerald McDonnell, Midlothian, VA (US); Jeffrey Cheesman, Saddle River, NJ (US)

(72) Inventors: Gerald McDonnell, Midlothian, VA (US); Jeffrey Cheesman, Saddle River, NJ (US)

(73) Assignee: Great Source Innovations LLC, Wilmington, DE (US)

( * ) Notice: Subject to any disclaimer, the term of this patent is extended or adjusted under 35 U.S.C. 154(b) by 6 days.

This patent is subject to a terminal disclaimer.

(21) Appl. No.: 15/650,356

(22) Filed: Jul. 14, 2017

(65) Prior Publication Data
US 2017/0314823 A1 Nov. 2, 2017

Related U.S. Application Data

(63) Continuation of application No. 15/152,334, filed on May 11, 2016, now Pat. No. 9,709,301, which is a
(Continued)

(51) Int. Cl.
*F25B 13/00* (2006.01)
*F24F 5/00* (2006.01)
(Continued)

(52) U.S. Cl.
CPC ............ *F25B 13/00* (2013.01); *F24F 5/0035* (2013.01); *F24F 11/79* (2018.01); *F24F 13/14* (2013.01);
(Continued)

(58) Field of Classification Search
CPC ......... F25B 13/00; F25B 49/02; F24F 5/0035; F24F 2001/0085; F25D 17/06; B23P 15/26
See application file for complete search history.

(56) References Cited

U.S. PATENT DOCUMENTS

| 6,062,028 A | 5/2000 | Arnold et al. |
| 9,091,485 B2 | 7/2015 | Bugler, III et al. |

(Continued)

OTHER PUBLICATIONS

Gottschalk, K. et al., "Safely Applying Chlorine Dioxide to USC Thermal Energy System", ChemTreat, Inc., Feb. 2013, pp. 1-33.
(Continued)

*Primary Examiner* — Marc E Norman
(74) *Attorney, Agent, or Firm* — Pepper Hamilton LLP

(57) ABSTRACT

An evaporative fluid cooling apparatus includes a cooling housing, at least two fluid coils, an air movement apparatus, and one or more spray apparatuses. The cooling housing defines a cooling chamber with an air housing input and an air housing output. The fluid coils are positioned in and extend across at least a portion of the cooling chamber in a spaced apart stacked arrangement. One of the fluid coils is positioned closer to the air housing output and has a first fluid input configured to be coupled to a fluid return from one or more air handler devices and a first fluid output coupled to a second fluid input to the other fluid coil. The other fluid coil is positioned closer to the air housing input and has a second fluid output configured to be coupled to a fluid supply to the air handler devices.

28 Claims, 6 Drawing Sheets

Related U.S. Application Data continuation of application No. 14/997,057, filed on Jan. 15, 2016.

(51) Int. Cl.
  *H05K 7/20* (2006.01)
  *F24F 11/79* (2018.01)
  *F24F 13/14* (2006.01)
  *F24F 13/20* (2006.01)
  *F24F 13/30* (2006.01)
  *F25B 1/00* (2006.01)

(52) U.S. Cl.
  CPC .............. *F24F 13/20* (2013.01); *F24F 13/30* (2013.01); *F25B 1/00* (2013.01); *H05K 7/20827* (2013.01)

(56) References Cited

U.S. PATENT DOCUMENTS

| | | | |
|---|---|---|---|
| 9,709,287 B1* | 7/2017 | McDonnell | F25B 13/00 |
| 9,709,301 B1* | 7/2017 | McDonnell | F25B 13/00 |
| 9,772,123 B2 | 9/2017 | McDonnell et al. | |
| 2017/0205093 A1* | 7/2017 | McDonnell | F25B 13/00 |
| 2017/0205094 A1* | 7/2017 | McDonnell | H05K 7/20827 |
| 2018/0073753 A1* | 3/2018 | LePoudre | H05K 7/20827 |

OTHER PUBLICATIONS

TECO, "Facts and Figures", Aug. 31, 2016, 2 pages, Retrieved from the Internet: <http://tecothermalenergy.com/about-teco/facts-and-figures/>.

Gottschalk, K., "Followup From Jun. 26 TECO Technical Review Meeting With Dan Dennis and Staff.", Jul. 31, 2008, 14 pages.

Chemtreat, Inc., "Teco Chlorine Dioxide Discussion", Apr. 18, 2011, 30 pages.

Chemtreat, Inc., TECO Technical Review Meeting, Nov. 18, 2010, 33 pages.

\* cited by examiner

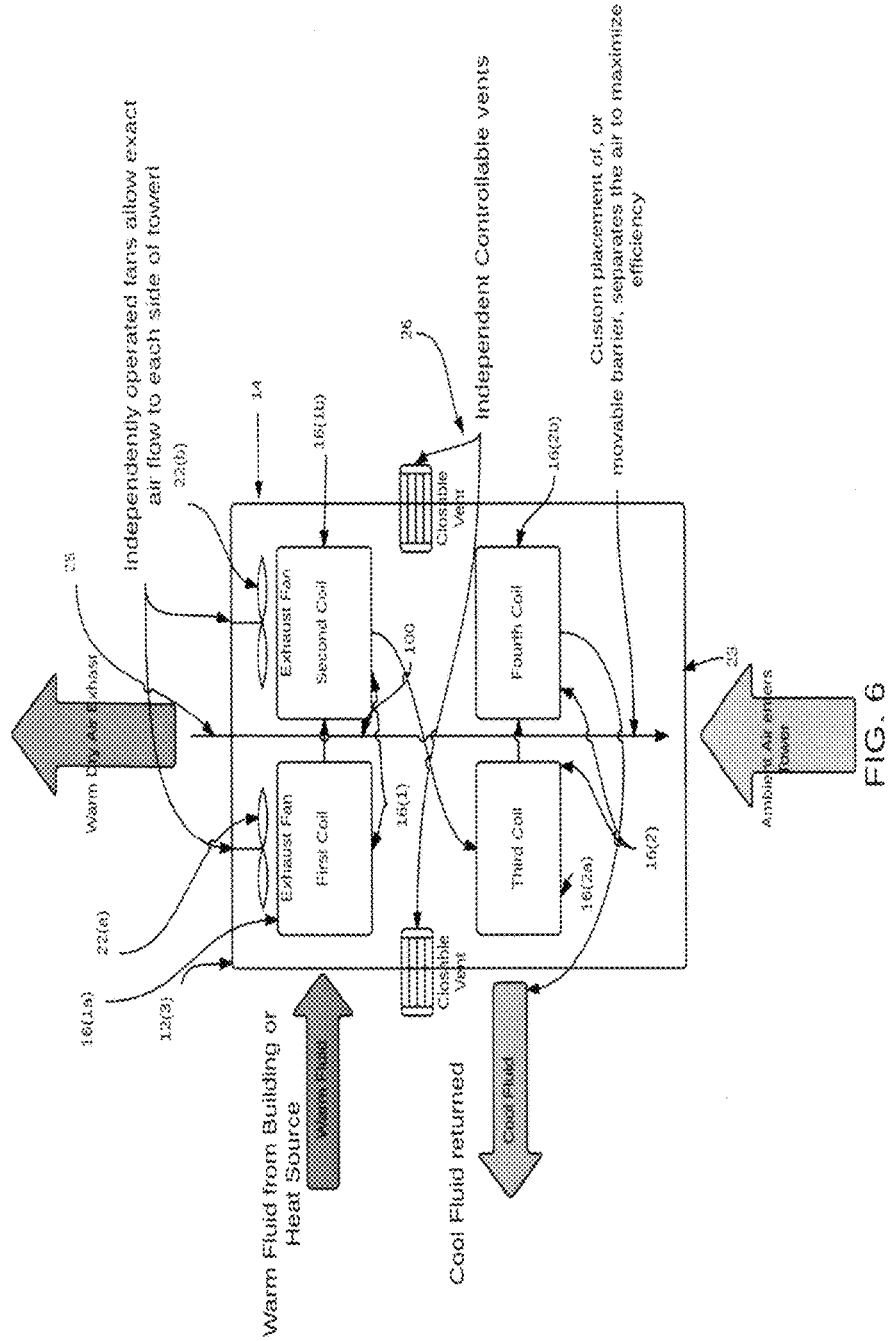

US 10,443,903 B2

EVAPORATIVE FLUID COOLING APPARATUSES AND METHODS THEREOF

This application is a continuation of prior U.S. patent application Ser. No. 15/152,334, filed May 11, 2016, which is a continuation of prior U.S. patent application Ser. No. 14/997,057, filed Jan. 15, 2016, which is hereby incorporated by reference in its entirety.

FIELD

This technology relates to evaporative fluid cooling apparatuses and methods thereof.

BACKGROUND

Currently, prior cooling systems in most commercial and data center operations operate with standard flow rates for water as high as over 300 gallons per minute (GPM). Unfortunately, moving this water through these prior cooling systems at these high flow rates does not allow for the absorption of much heat by each gallon of water resulting in only a small difference between the temperature of the water entering and leaving these prior cooling systems resulting in low delta T syndrome. Typically, with low delta T syndrome the flow rate or gallons per minute is high and the temperature difference is low between about ten to twelve degrees and in reality often between about two and ten degrees. As a result of these design issues, these prior cooling systems often work acceptably, but require very significant amounts of energy and maintenance.

To address this issue, prior solutions have tried various combinations of increasing the flow and/or adding more cooling towers. Unfortunately, increasing the flow may again have a negative impact on the amount of temperature drop or delta T which is attainable and thus is not a viable solution. Further, the addition of more cooling towers, related piping, and pumps adds further expense and takes up a greater amount of space, none of which is desirable.

SUMMARY

An evaporative fluid cooling apparatus includes a cooling housing, at least two fluid coils, an air movement apparatus, and one or more spray apparatuses. The cooling housing defines a cooling chamber with an air housing input and an air housing output. At least two fluid coils are positioned in and extend across at least a portion of the cooling chamber in a spaced apart stacked arrangement. One of the fluid coils is positioned closer to the air housing output having a first fluid input configured to be coupled to a fluid return from one or more air handler devices and a first fluid output coupled to a second fluid input to the other one of the fluid coils. The other one of the fluid coils is positioned closer to the air housing input and has a second fluid output configured to be coupled to a fluid supply to the one or more air handler devices. The air movement apparatus is positioned to provide air flow from the air housing input through the cooling chamber and out the air housing output when activated. The one or more spray apparatuses are positioned and configured to spray a fluid on at least one of the at least two fluid coils when activated.

A method for making an evaporative fluid cooling apparatus includes providing a cooling housing that defines a cooling chamber with an air housing input and an air housing output. At least two fluid coils are positioned to extend across at least a portion of the cooling chamber in a spaced apart stacked arrangement. One of the fluid coils is positioned closer to the air housing output and has a first fluid input configured to be coupled to a fluid return from one or more air handler devices and a first fluid output coupled to a second fluid input to the other one of the fluid coils. The other one of the fluid coils is positioned closer to the air housing input with the other one of the fluid coils having a second fluid output configured to be coupled to a fluid supply to the one or more air handler devices. An air movement apparatus is positioned to provide air flow from the air housing input through the cooling chamber and out the air housing output when activated. One or more spray apparatuses are positioned and configured to spray a fluid on at least one of the at least two fluid coils when activated.

This technology provides a number of advantages including providing more effective and efficient evaporative fluid cooling apparatuses and methods. In particular, this technology provides evaporative fluid cooling apparatuses which are able to achieve a high delta T and a low flow rate, i.e. gallons per minute (GPM), that are able to easily avoid low delta syndrome. By way of example, this technology can provide a high delta T of between twenty degrees to forty-five degrees and also a low flow rate or gallons per minute. Additionally, with this high delta T and a low flow rate design, this technology is able to provide a significant reduction, i.e. often in excess of 50%, in the size and cost of piping and other parts when compared against prior cooling systems. Further, with this high delta T and a low flow rate design, this technology is able to output pure, non-saturated air and is able to utilize sprayer water that is chemical free. This technology also allows for a unique phased in integration of the compressor chiller that allow that compression chiller to operate at a greatly reduced lift compared to prior designs thereby lowering kW/ton relationship.

BRIEF DESCRIPTION OF THE DRAWINGS

FIG. 6 is functional block diagram of an example of yet another evaporative fluid cooling apparatus with a dual split fluid coil and housing.

DETAILED DESCRIPTION

Figure 1:
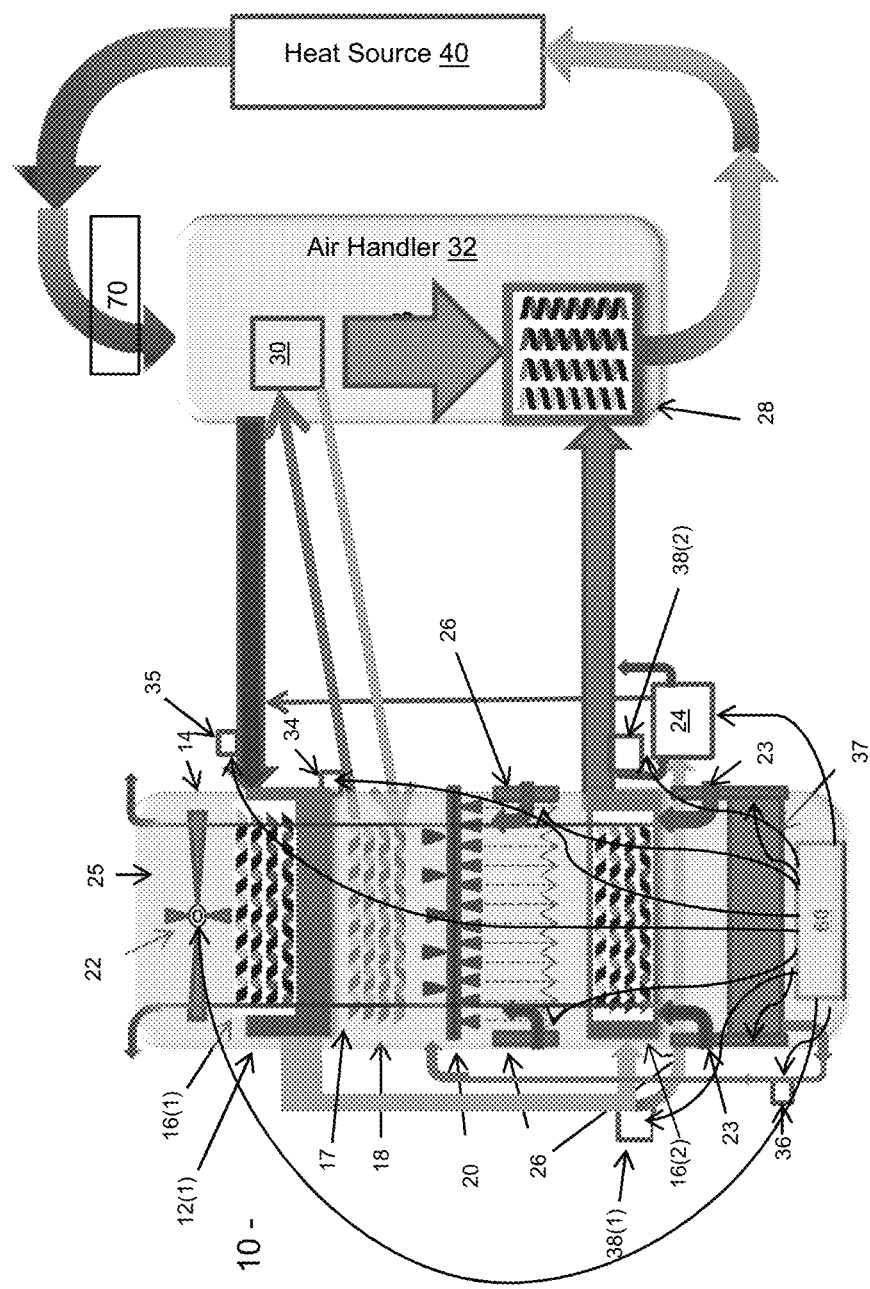
FIG. 1 is a functional block diagram of an example of an environment with an example of an evaporative fluid cooling apparatus with a refrigerant coil.

An environment 10 with an example of an evaporative fluid cooling apparatus 12(1), air handler 32, and heat source 40, such as a building by way of example only, is illustrated in FIG. 1. In this particular example, the evaporative fluid cooling apparatus 12(1) includes a cooling housing 14, at least two fluid coils 16(1)-16(2), an optional refrigerant coil 18, a sprayer apparatus 20, an air movement apparatus 22, an optional compressor chiller 24, and evaporative cooler management computing device 60, although the apparatus could include other types and numbers of systems, devices, components, and/or other elements in other configurations, such as those illustrated in FIGS. 5 and 6 by way of example only. This technology provides a number of advantages including providing more effective and efficient evaporative fluid cooling apparatuses and methods.

The cooling housing 14 has side walls which define a cooling chamber 17 having air input 23 and an air output 25 and provides a supporting structure for the fluid coils 16(1)-16(2), the optional refrigerant coil 18, the sprayer apparatus 20, the air movement apparatus 22, the optional compressor chiller 24, the collection device 37, and the evaporative cooler management computing device 60 of the evaporative fluid cooling apparatus 12(1), although the housing 14 could have other configurations and could provide a supporting structure for other types and/or numbers of other systems, devices, components, and/or other elements.

The cooling housing 14 may also optionally include one or more controllable vents or louvers 26 along one or more side surfaces of the cooling housing 14, although the housing 14 could provide other types and/or numbers of adjustable access points. In this particular example, the controllable vents or louvers 26 are each constructed to at least have a closed position to seal a corresponding opening in the cooling housing 14 and an open position which can be managed by the controller. In the open position, the vents or louvers 26 provide a passage to allow the introduction of fresh, cool and dryer outside air to enter the cooling chamber 17 and pass between one or more of the fluid coils 16(1)-16(2) and/or the optional refrigerant coil 18 to increase the free cooling effects, further reducing the need to engage and also the possible load on the compressor chiller 24 when engaged.

Each of the controllable vents or louvers 26 may have a controller comprising a processor, a memory, a communication interface which are coupled together by a bus or other communication link, although other types and/or numbers of other systems, device, components, and/or other elements in other configurations could be used and/or other approaches for managing the operation of the controllable vents or louvers 26 may be used. Each of the controllers in the controllable vents or louvers 26 may be coupled to receive, respond to and/or execute instructions from the evaporative cooler management computing device 60 to move the controllable vents or louvers 26 between open and closed positions using one or more electromechanical control devices, although the operation of the controllable vents or louvers 26 may be managed in other manners, such as manually by way of example only, and may be configured to perform other types and/or numbers of other operations.

The fluid coils 16(1)-16(2) each comprise heat transfer working fluid conduits with one of the fluid coils 16(1) having an input that is configured to be coupled to a return of cooling fluid, an output of the fluid coil 16(1) is coupled to an input of the fluid coil 16(2), although other types and/or numbers of fluid coils in other configurations may be used. The fluid coil 16(1) which receives the initial return of the heated fluid from the air handler 32 is located in the cooling housing 14 adjacent the air output 25. The fluid coil 16(2) which receives the fluid from the fluid coil 16(1) is located adjacent the air inputs 23 in the cooling housing 14. Accordingly, with this configuration to receive fluid in the fluid coil 16(1) adjacent the air output 25 of the cooling housing 14 and then to further cool and return fluid to the fluid coil 16(2) adjacent the air input 23 of the cooling housing 14 is in an inverse with respect to the absorption of heat from the fluid in the fluid coils 16(1)-16(2) in the cooling housing 14 based on a direction of air flow from the one or more air inputs 23 to the air output 25. As a result, with this configuration heated fluid from the air handler 32 may now be transported to the fluid coils 16(1)-16(2) in the evaporative fluid cooling apparatus 12(1) at lower volumes than possible with prior designs because the heated fluid carries more heat energy per unit volume.

In particular, with this example when the heated fluid enters the fluid coil 16(1) adjacent the air output 25 of the cooling housing 14, the heated fluid in the fluid coil 16(1) will be exposed to cool wet air that has already been cooled and supersaturated by the second coil 16(2) adjacent the air inputs 23 and through evaporative cooling of spray water from the sprayer apparatus 20 to nearly the wet bulb temperature in the atmosphere. When the cool wet air hits the fluid coil 16(1), it absorbs heat, and by the time it exits the cooling housing 14 at the air output 25, it is at or warm enough that it has more than enough space for the water it has absorbed and also eliminates plumes. At the same time the fluid in the fluid coil 16(1) is cooled, so that by the time it enters the fluid coil 16(2) less cooling is required to reach nearly the wet bulb temperature. As a result, this example of the technology essentially provides free cooling all the way up to a wet bulb of about 60 degrees Fahrenheit or an ambient temperature of about 80 degrees without needing to engage the compressor chiller 24 and also provides other benefits, such as substantial savings in energy, a high delta T and a low required flow rate for the fluid from the air handler 32 by way of example.

An example of the benefits of this high delta T and low flow rate design with this technology resulting in reduced requirements for the fluid coils 16(1)-16(2) and related piping is set forth below. Again as noted earlier, this technology is able to utilize a high delta T of between twenty degrees to forty-five degrees and also a low flow rate or gallons per minute. Additionally, the formula for calculating a ton is (GPM×8.33)×Delta T=BTU. Accordingly, assuming a delta T of thirty five degrees, an example of the decrease in flow requirements is set forth below:

(100 GPM×8.33)×10=8,330 BTU (50 GPM×8.33)×35=14,577 BTU

As illustrated above, the lower GPM with the higher delta T, e.g. thirty-five degrees in this example, in accordance with an example of this technology when compared against a prior cooling system with a low delta T of ten which is typical for prior systems has the higher BTU. Accordingly, by using this technology a significant reduction in size and cost, i.e. purchase and installation, as well as a reduction in tonnage demands on the chiller can be achieved.

A fluid pump 35 may be coupled to the piping to the fluid coil 16(1), although the fluid pump may be in other locations and other types and/or numbers of fluid movement devices maybe used. The fluid pump 35 may have a controller comprising a processor, a memory, a communication interface which are coupled together by a bus or other communication link, although other types and/or numbers of other systems, device, components, and/or other elements in other configurations could be used and/or other approaches for managing the operation of the fluid pump 34 may be used. The controller in the fluid pump 35 may be coupled to receive, respond to and/or execute instructions from the evaporative cooler management computing device 60 to manage the engagement of and rate of pumping of the cooling fluid through the loop from the fluid coils 16(1)-16(2) and out to the air handler 32 and back, although the operation of the fluid pump 35 may be managed in other manners, such as manually by way of example only and may be configured to perform other types and/or numbers of other operations.

With this low flow rate design, this technology is able to utilize a much smaller, less expensive, and more energy efficient fluid pump 35 than possible with prior evaporative cooling system. Additionally, with this low flow rate design this technology is able to use much thinner fluid coils 16(1)-16(2) and connecting pipes than prior cooling evaporative fluid cooling systems which provides a significant reduction in size and cost. Further, the ability to use much thinner fluid coils 16(1)-16(2) with this technology when compared to prior cooling systems enables air to more easily flow from the air inputs 23 through the fluid coils 16(1)-16(2) in the cooling chamber 17 to the air output 25 reducing the size and required power for the air movement apparatus 22.

The optional refrigerant coil 18 comprises another heat transfer conduit and has an input that is configured to be coupled to a return from a refrigerant system 30 and an output that is configured to be coupled to a supply from the refrigerant system 30, although other types and/or numbers of refrigerant coils coupled to other types and/or numbers of sources could be used. In this particular example, the refrigerant system 30 is positioned in the air handler 32 to remove a significant amount of heat prior to the air reaching a heat exchanger 28 in the air handler 32, to provide additional cooling.

A refrigerant pump 34 may be coupled to the piping between the optional refrigerant coil 18 and the refrigerant system 30, although the refrigerant pump 34 may be in other locations and other types and/or numbers of fluid movement devices maybe used. In this particular example, the refrigerant pump 34 is a frictionless magnetic bearings type pump which as result is oil free and thus more efficient and lower maintenance, although other types of pumps could be used, such as a pump with sealed bearings unit that does not require oil in the refrigerant. Using an oil free refrigerant pump 34 provides advantages because oil is an insulator and as result does not take heat, but does take up volume which greatly reducing the efficiency of the refrigerant fluid, increasing efficiency by up to 20%.

The refrigerant pump 34 may have a controller comprising a processor, a memory, a communication interface which are coupled together by a bus or other communication link, although other types and/or numbers of other systems, device, components, and/or other elements in other configurations could be used and/or other approaches for managing the operation of the refrigerant pump 34 may be used. The controller in the refrigerant pump 34 may be coupled to receive, respond to and/or execute instructions from the evaporative cooler management computing device 60 to manage the engagement of and rate of pumping of the refrigerant fluid through the loop from between the optional refrigerant coil 18 and the refrigerant system 30, although the operation of the refrigerant pump 34 may be managed in other manners, such as manually by way of example only and may be configured to perform other types and/or numbers of other operations.

The sprayer apparatus 20 may include a sprayer pump 36 with a controller, piping, and a plurality of nozzles oriented to spray a fluid, such as water by way of example only, on and positioned above the fluid coil 16(2) and below the optional refrigerant coil 18 and the fluid coil 16(2) to cool the air in the cooling chamber 17 via evaporative cooling, although the sprayer apparatus 20 could be positioned in other locations and/or to spray on other devices, such as the fluid coil 16(1) by way of example only. Any non-evaporated water or other fluid that was sprayed drips down into a collection device 37 and may be pumped by the sprayer pump 36 back to the nozzles until evaporated.

The sprayer pump 36 may have a controller comprising a processor, a memory, a communication interface which are coupled together by a bus or other communication link, although other types and/or numbers of other systems, device, components, and/or other elements in other configurations could be used and/or other approaches for managing the operation of the sprayer pump 36 may be used. The controller in the sprayer pump 36 may be coupled to receive, respond to and/or execute instructions from the evaporative cooler management computing device 60 to manage the engagement of and rate of pumping of the spray fluid through the loop from between the sprayer apparatus 20 and the collection device 37, although the operation of the sprayer pump 36 may be managed in other manners, such as manually by way of example only and may be configured to perform other types and/or numbers of other operations.

The air movement apparatus 22, such as a fan by way of example only, is connected at the top of the cooling housing 14 and when activated generates a flow of air through the cooling chamber 17 from the one or more air inputs 23 through the cooling chamber 17 and out the air output 25, although other types and/or numbers of air movement apparatuses in other locations could be used. The air movement apparatus 22 may have a controller comprising a processor, a memory, a communication interface which are coupled together by a bus or other communication link, although other types and/or numbers of other systems, device, components, and/or other elements in other configurations could be used and/or other approaches for managing the operation of the sprayer pump 36 may be used. The controller in the air movement apparatus 22 may be coupled to receive, respond to and/or execute instructions from the evaporative cooler management computing device 60 to manage the engagement of and rate air flow from the one or more air inputs 23 through the cooling chamber 17 and out the air output 25, although the operation of the air movement apparatus 22 may be managed in other manners, such as manually by way of example only and may be configured to perform other types and/or numbers of other operations.

Figure 2:
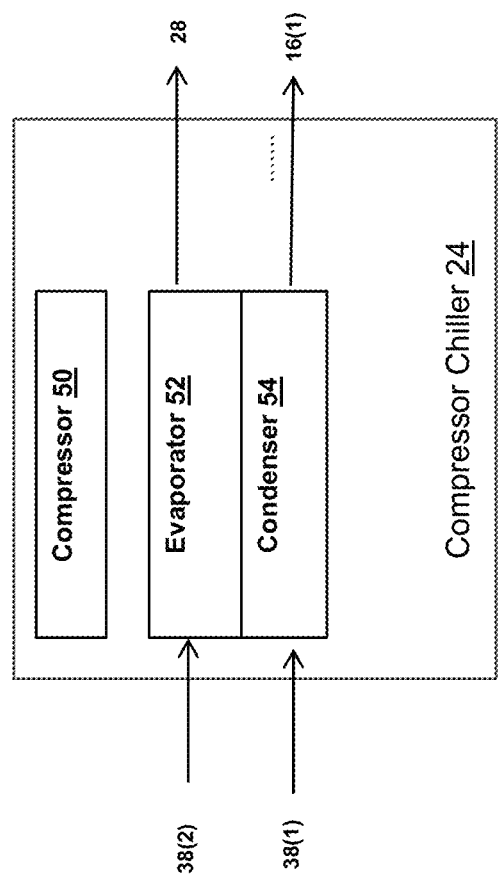
FIG. 2 is a block diagram of an example of the compressor chiller illustrated in FIG. 1.
Figure 3:
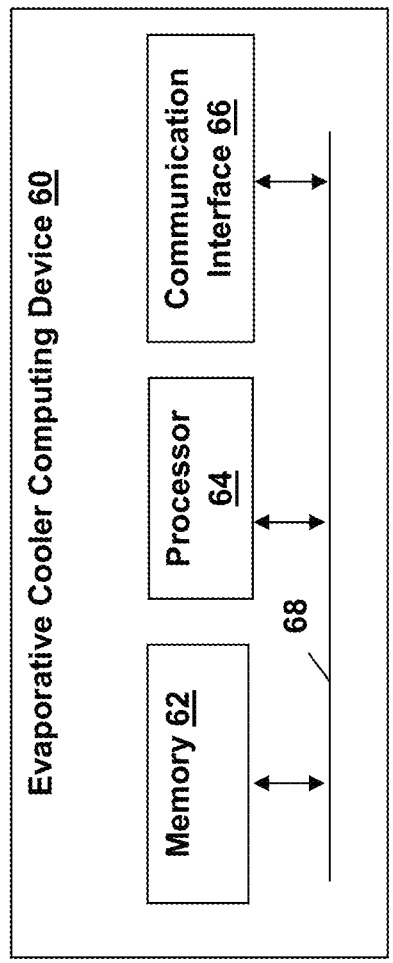
FIG. 3 is a block diagram of an example of an evaporative cooler management computing device illustrated in FIG. 1.
Figure 4:
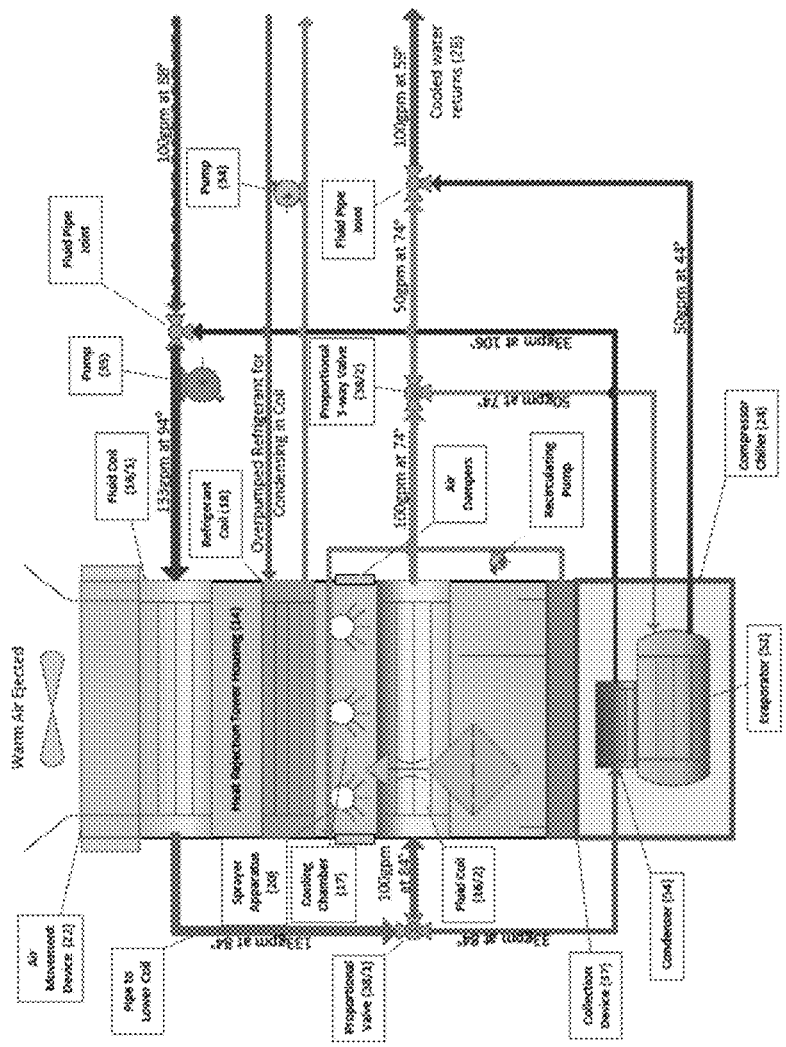
FIG. 4 is a functional block diagram of an example of operating the evaporative fluid cooling apparatus with the refrigerant coil illustrated in FIG. 1.

Referring to FIGS. 1 and 2, the optional compressor chiller 24 has a first compressor chiller input coupled to an output of the fluid coil 16(1), a second compressor chiller input coupled to an output of the fluid coil 16(2), a first compressor chiller output coupled to the input of the fluid coil 16(1), and a second compressor chiller output configured to be coupled to the fluid supply to the one or more air handler device 32. The compressor chiller 24 is a physical compressor 50 that compresses a refrigerant fluid to allow it to create cold in an evaporator 52, the heat removed from the cooling fluid, such as water by way of example, into the refrigerant fluid is transferred back into the cooling fluid returning back to the input of the fluid coil 16(1) via the condenser 54. During warmer weather, such as a temperature above a wet bulb of about 60 degrees Fahrenheit or an ambient temperature of about 80 degrees, the compressor 50 in the compressor chiller 24 mounted below or next to the cooling housing 14 may be engaged to remove a percentage of the cooling fluid from the output of the fluid coil 16(2), uses compressed refrigerant fluid to cool some of that cooling fluid in order to cool a percentage of that cooling fluid, and then combines it with the other cooling fluid from the output of the fluid coil 16(2) for return to the heat exchange device 28 in air handler 32 so as to effectively deliver the desired temperature of return cooling fluid. Meanwhile, the heat removed by the refrigerant fluid is moved into the remaining cooling fluid taken and, as noted above, is routed back to the input to the fluid coil 16(1) of the cooling housing 14 to combine with the heated cooling fluid coming back from the air handler 32 for heat rejection.

The optional compressor chiller 24 may have a controller comprising a processor, a memory, a communication interface which are coupled together by a bus or other communication link, although other types and/or numbers of other systems, device, components, and/or other elements in other configurations could be used and/or other approaches for managing the operation of the optional compressor chiller 24 may be used. The controller in the optional compressor chiller 24 may be coupled to receive, respond to and/or execute instructions from the evaporative cooler management computing device 60 to manage the engagement of and rate of operation of the optional compressor chiller 24, although the operation of the optional compressor chiller 24 may be managed in other manners, such as manually by way of example only and may be configured to perform other types and/or numbers of other operations.

A first coil diverter valve apparatus 38(1) may be adjusted to divert the flow of the cooling fluid and has a first coil diverter valve input coupled to an output of the fluid coil 16(1), a first coil diverter valve output coupled to an input to the fluid coil 16(2), and a second coil diverter valve output coupled to an input to the optional compressor chiller 24, although other manners for diverting the flow of the cooling fluid can be used. A second coil diverter valve apparatus valve 38(2) has a first second coil diverter valve input coupled to the output of the fluid coil 16(2), a first coil diverter valve output coupled to an input of the optional compressor chiller 24, and a second coil diverter valve output configured to be coupled to the fluid supply to the air handler device 32. In this example, first coil diverter valve apparatus 38(1) and the second coil diverter valve apparatus valve 38(2) are uniquely positioned inside this example of the design to allow the compressor chiller 24 to operate at a much lower lift than possible with prior designs therefore lowering kw\ton even in extreme atmosphere conditions.

Each of the first coil diverter valve apparatus 38(1) and the second coil diverter valve apparatus valve 38(2) may have a controller comprising a processor, a memory, a communication interface which are coupled together by a bus or other communication link, although other types and/or numbers of other systems, device, components, and/or other elements in other configurations could be used and/or other approaches for managing the operation of the first coil diverter valve apparatus 38(1) and the second coil diverter valve apparatus valve 38(2) may be used. Each of the controllers in the first coil diverter valve apparatus 38(1) and the second coil diverter valve apparatus valve 38(2) may be coupled to receive, respond to and/or execute instructions from the evaporative cooler management computing device 60 to move the first coil diverter valve apparatus 38(1) and the second coil diverter valve apparatus valve 38(2) between open and closed positions using one or more electromechanical control devices to control an amount of the cooling fluid which is diverted, although the operation of the first coil diverter valve apparatus 38(1) and/or the second coil diverter valve apparatus valve 38(2) may be managed in other manners, such as manually by way of example only, and may be configured perform other types and/or numbers of operations.

The evaporative cooler management computing device 60 includes a processor 62, a memory 64, and a communication interface 66 which are coupled together by a bus 68 or other communication link, although the evaporative cooler management computing device 60 may include other types and/or numbers of elements in other configurations.

The processor 62 of the evaporative cooler management computing device 60 may execute one or more computer-executable instructions stored in the memory 64 for the methods illustrated and described with reference to the examples herein, although the processor can execute other types and/or numbers of programmed instructions and may be configured to be capable of performing other types and/or numbers of operations. The processor 60 in the evaporative cooler management computing device 60 may comprise one or more central processing units ("CPUs") or general purpose processors with one or more processing cores, although other types of processor(s) could be used.

The memory 64 of the evaporative cooler management computing device 60 stores these programmed instructions for one or more aspects of the present technology as described and illustrated by way of the examples herein, although some or all of the programmed instructions could be stored and executed elsewhere. A variety of different types of memory storage devices, such as random access memory (RAM), read only memory (ROM), hard disk drives, solid state drives, or other computer readable media which is read from and written to by a magnetic, optical, or other reading and writing system that is coupled to the processor 62, can be used for the memory 64.

The communication interface 66 operatively couples and communicates between the evaporative cooler management computing device 60 and a controller for each of the air movement apparatus 22, the compressor chiller 24, the controllable vents 26, the refrigerant pump 34, the fluid pump 35, and the coil diverter valve apparatuses 38(1) and 38(2) which are all coupled together by one or more communication networks, although other types and/or numbers of communication networks or systems with other types and numbers of connections and configurations to other devices and elements. By way of example only, the one or more communication networks can use TCP/IP over Ethernet and industry-standard protocols, including NFS, CIFS, SOAP, XML, LDAP, and SNMP, although other types and numbers of communication networks, can be used.

In this example, an air handler 32 with one or more heat exchangers 28 may have an optional dampening device 70 coupled to an input from a cooling loop with a heat source 40, such as a building by way of example only, and another cooling loop with the evaporative fluid cooling apparatus 12(1), although the evaporative fluid cooling apparatus 12(1) could be coupled to other types and/or numbers of other systems in other manners. If the air handler 28 has more than one heat exchanger, the heat exchanger 28 adjacent the input to the air handler 28 may use a refrigerant fluid with a different boiling point than another heat exchanger 28 near an output from the air handler 28. The optional dampening device 70 may have a controller comprising a processor, a memory, a communication interface which are coupled together by a bus or other communication link, although other types and/or numbers of other systems, device, components, and/or other elements in other configurations could be used and/or other approaches for managing the operation of the dampening device 70 may be used. The controller in the optional dampening device 70 may be coupled to receive, respond to and/or execute instructions from the evaporative cooler management computing device 60 to manage and optimize operation of the dampening device 70, although the operation of the optional compressor chiller 24 may be managed in other manners, such as manually by way of example only and may be configured to perform other types and/or numbers of other operations. The air handler 28 may also have the refrigerant system 30 in the return air flow from the heat source 40, although the air handler may have other types and/or numbers of other systems, devices, components and/or other elements in other configurations.

The evaporative cooler management computing device 60 may be coupled to send, respond to and/or execute one or more programmed instructions for managing the operation of one or more of the controllers for the air movement apparatus 22, the optional compressor chiller 24, the controllable vents or louvers 26, the refrigerant pump 34, the fluid pump 35, the sprayer pump 36, and the first coil diverter valve apparatus 38(1) and the second coil diverter valve apparatus valve 38(2) to react to the changing environment and changing load requirements of the heat source 40, such as a building by way of example only, and these controls may be based on input data and/or based on one or more characteristics, such as current outside temperature or current fluid temperature by way of example only. As the outdoor temperature increases, the evaporative cooler management computing device 60 may have programmed instructions to automatically increase fan speed of the air movement apparatus 22, then to start the sprayer pump 36, and then adjust the rate of cooling fluid to the compressor chiller 24 and engage the operation of the compressor chiller 24 in small increments, and only to the point necessary to achieve the desired exiting cooling fluid temperature. The evaporative cooler management computing device 60 may also have programmed instructions to adjust the opening of the controllable vents or louvers 26, the engagement of and rate of refrigerant pumped by the refrigerant pump 34, and/or the rate of cooling fluid being pumped fluid pump 35 to achieve the desired exiting cooling fluid temperature. Since the evaporative cooler management computing device 60 may be located in the same unit as the fluid coils 16(1)-16(2) and/or and the chiller compressor 24 which may be in or outside the cooling chamber 17, it will instantly react to changes during the day, may have programmed instructions and prior stored operation data to predict the needs in the near future and adapt to each variable as they change to operate the unit in the most efficient way possible.

Although the exemplary environment 10 with evaporative fluid cooling apparatus 12(1) which has the evaporative cooler management computing device 60 and the controllers for the air movement apparatus 22, the optional compressor chiller 24, the controllable vents or louvers 26, the refrigerant pump 34, the fluid pump 35, the sprayer pump 36, and the first coil diverter valve apparatus 38(1) and the second coil diverter valve apparatus valve 38(2) are described and illustrated herein, other types and numbers of systems, devices, components, and/or elements in other topologies can be used. It is to be understood that the systems of the examples described herein are for exemplary purposes, as many variations of the specific hardware and software used to implement the examples are possible, as will be appreciated by those skilled in the relevant art(s).

In addition, two or more computing systems or devices can be substituted for any one of the systems or devices in any example. Accordingly, principles and advantages of distributed processing, such as redundancy and replication also can be implemented, as desired, to increase the robustness and performance of the devices and systems of the examples. The examples may also be implemented on computer system(s) that extend across any suitable network using any suitable interface mechanisms and traffic technologies, including by way of example only teletraffic in any suitable form (e.g., voice and modem), wireless traffic media, wireless traffic networks, cellular traffic networks, G3 traffic networks, Public Switched Telephone Network (PSTNs), Packet Data Networks (PDNs), the Internet, intranets, and combinations thereof.

The examples may also be embodied as one or more non-transitory computer readable media having instructions stored thereon for one or more aspects of the present technology as described and illustrated by way of the examples herein, as described herein, which when executed by a processor, cause the processor to carry out the steps necessary to implement the methods of the examples, as described and illustrated herein.

An example of a method for using an evaporative cooler apparatus 12(1) will now be described with reference to FIGS. 1-4. In this particular example, the optional dampening device 70 may be adjusted by the evaporative cooler management computing device 60 based on at least one characteristic, such as outside air temperature by way of example only, to provide the appropriate mix of outside air with returning air from the heat source 40, such as a building by way of example only, to the air handler 28, although other manner for managing the air supplied to the air handler 28 can be used. Meanwhile, cooling fluid in the heat exchanger 28 in the air handler 32 is continuously managed by the evaporative cooler apparatus 12(1) to ensure maximum heat absorption at exit from the heat exchanger 28 back to the heat source 40.

To manage this cooling fluid, a fluid pump 35 in the evaporative cooler apparatus 12(1) when activated and the rate of operation is controlled by the evaporative cooler management computing device 60 based on at least one characteristic, such as desired temperature by way of example only, pumps the cooling fluid in the pipes through the fluid coil 16(1) adjacent the air output 25 in the cooling chamber 17 and then through the fluid coil 16(2) adjacent the one or more air inputs 23 in the cooling chamber 17, although other types and/or numbers of fluid movement devices in other locations may be used. Accordingly as discussed earlier, this configuration to receive fluid in the fluid coil 16(1) adjacent the air output 25 of the cooling housing 14 and then to further cool and return fluid to the fluid coil 16(2) adjacent the air input 23 of the cooling housing 14 is in an inverse with respect to the absorption of heat from the fluid in the fluid coils 16(1)-16(2) in the cooling housing 14 based on a direction of air flow from the one or more air inputs 23 to the air output 25. As a result, with this configuration heated fluid from the air handler 32 may now be transported to the fluid coils 16(1)-16(2) in the evaporative fluid cooling apparatus 12(1) at lower volumes than possible with prior designs because the heated fluid carries more heat energy per unit volume.

In this particular example, when activated, cooling fluid, such as cooling fluid having a flow rate of 100 GPM and a temperature of 88 degrees in this example, containing heat from the heat exchangers 28 air handler 32 is received. This cooling fluid may be combined with heated cooling fluid from the optional compressor chiller 24, when activated and managed by the evaporative cooler management computing device 60 based on at least one characteristic, such as fluid temperature by way of example only, via one of the outputs from the second coil diverter valve apparatus valve 38(2) also activated and managed by the evaporative cooler management computing device 60, to provide in this example cooling fluid having a flow rate of 133 GPM at a temperature of 94 degrees to an input of the fluid coil 16(1). This cooling fluid having a flow rate of 133 GPM at a temperature of 94 degrees enters the fluid coil 16(1) in the cooling chamber 17 adjacent the air output 25 and transfers as much heat energy in the cooling fluid as possible to the atmosphere and then exits as cooling fluid having a flow rate of 133 GPM at a temperature of 84 degrees in this example via an output from the fluid coil 16(1). Accordingly, in this example through reheating cooled air coming up the cooling chamber 17 from the fluid coil 16(2), the cooling fluid in fluid coil 16(1) is precooled for the fluid coil 16(2).

In this example, this cooling fluid descends to an input of the first coil diverter valve apparatus valve 38(1) activated and managed by the evaporative cooler management computing device 60 and which has a first output to divert an adjustable portion of the cooling fluid, in this example cooling fluid having a flow rate of 100 GPM at a temperature of 84 degrees, to an input of the fluid coil 16(2) adjacent air inputs 23 in the cooling chamber 17 and a second output to divert an adjustable portion of the cooling fluid, in this example cooling fluid having a flow rate of 33 GPM at a temperature of 84 degrees, to the optional compressor chiller 24. In this example, until a wet bulb of about 60 degrees Fahrenheit or an ambient temperature of about 80 degrees is reached, the first coil diverter valve apparatus valve 38(1) would not divert any cooling fluid to the compressor chiller 24, although the diversion of cooling fluid to the compressor chiller 24 by the first coil diverter valve apparatus valve 38(1) can be at other stored temperatures.

The precooled cooling fluid enters the fluid coil 16(2) which transfers as much heat energy as possible in the cooling fluid to the atmosphere in the cooling chamber 17. Spray water from the sprayer apparatus 20 at a rate adjusted and managed by the evaporative cooler management computing device 60 assists with this heat transfer through vaporization. The cooling fluid then exits the fluid coil 16(2) in this example as cooling fluid having a flow rate of at 100 GPM at a temperature of 74 degrees, via an output from the fluid coil 16(2) to an input of the second coil diverter valve apparatus valve 38(2). The operation of how much if any cooling fluid is diverted by the second coil diverter valve apparatus valve 38(2) is managed by the evaporative cooler management computing device 60 based on at least one characteristic, such as one or more temperature readings by way of example only. Again, in this example until a wet bulb of about 60 degrees Fahrenheit or an ambient temperature of about 80 degrees is reached, the second coil diverter valve apparatus valve 38(1) would not divert any cooling fluid to the compressor chiller 24, although the diversion of cooling fluid to the compressor chiller 24 by the first coil diverter valve apparatus valve 38(1) can be at other stored temperatures. In this particular example, the second coil diverter valve apparatus valve 38(2) has a first output that is configured to provide cooling fluid having a flow rate of 67 GPM at a temperature of 74 degrees is diverted to the piping towards the heat exchanger 28 and a second output is coupled to provide another adjustable portion of this cooling fluid, in this particular example cooling fluid having a flow rate of 33 GPM at a temperature of 74 degrees to the compressor chiller 24.

Accordingly, in this example as described above when the heated cooling fluid enters the fluid coil 16(1) adjacent the air output 25 of the cooling housing 14, the heated cooling fluid in the fluid coil 16(1) will be exposed to cool wet air that has already been cooled and supersaturated by the second coil 16(2) adjacent the air inputs 23 and through evaporative cooling of spray water from the sprayer apparatus 20 at a rate adjusted and managed by the evaporative cooler management computing device 60 to nearly the wet bulb temperature in the atmosphere. When the cool wet air hits the fluid coil 16(1) by activation and management of the rate of operation of the air movement device 22 by the evaporative cooler management computing device 60 based on at least one characteristic, such as outside air temperature by way of example only, to provide and manage an air flow rate from the one or more air inputs 23 to the air output 25, the flowing air in the cooling chamber 17 absorbs heat, and by the time it exits the cooling housing 14 at the air output 25, it is at or warm enough that it has more than enough space for the water it has absorbed and also eliminates plumes. By the time the cooling fluid in the fluid coil 16(1) enters the fluid coil 16(2), less cooling is required to reach nearly the wet bulb temperature. As a result, this example of the technology essentially provides free cooling all the way up to a wet bulb of about 60 degrees Fahrenheit or an ambient temperature of about 80 degrees without needing to engage the compressor chiller 24 and also provides other benefits, such as substantial savings in energy, a high delta T and a low required flow rate for the fluid from the air handler 32 by way of example. The optional vents or louvers 26 may also be activated and managed by the evaporative cooler management computing device 60 based on at least one characteristic, such as outside air temperature by way of example only, to be adjusted to different open positions to provide additional air flow into the cooling chamber 17.

The evaporative cooler management computing device 60 is coupled to a temperature monitoring device configured to monitor a temperature of a fluid and the compressor chiller 28. In this example, above the temperatures noted above, the optional compressor chiller 24 may be activated and managed by the evaporative cooler management computing device 60 to cool an adjustable portion of the received cooling fluid based on at least one characteristic, such as fluid temperature by way of example only. In particular, in this example cooling fluid having a flow rate of 33 GPM at a temperature of 62 degrees, and which is then combined with the cooling fluid having a flow rate of 67 GPM at a temperature of 74 degrees. This cooling fluid having a flow rate of 100 GPM at a temperature of 70 degrees is then provided to the supply to the air handler 32. Additionally, the other adjustable portion of the received cooling fluid, in this particular example cooling fluid having a flow rate of 33 GPM at a temperature of 96 degrees, which is being used to transfer the extracted heat from the other cooling fluid in the compressor chiller 24 just described above, is provided back to the input to the fluid coil 16(1) as described earlier.

Additionally, the evaporative fluid cooling apparatus 12(1) may have refrigerant fluid that enters an input of the optional refrigerant coil 18 when a refrigerant pump 34 is activated and managed by the evaporative cooler management computing device 60 and transfers as much heat energy in the refrigerant fluid as possible to the atmosphere and then exits via an output to refrigerant system 30 integrated with the air handler 32 in the building 40 to complete the loop.

Figure 5:
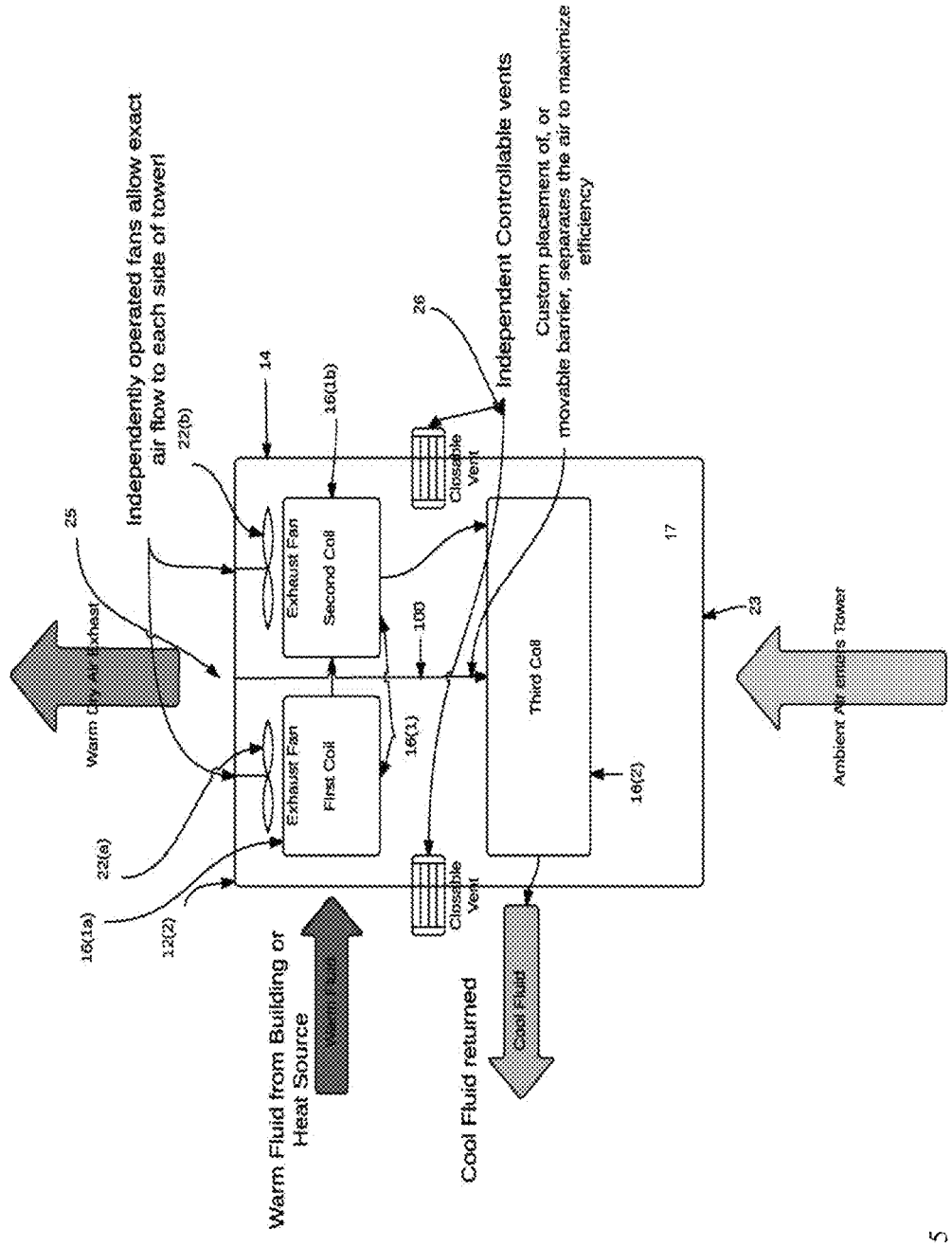
FIG. 5 is functional block diagram of an example of another evaporative fluid cooling apparatus with a split fluid coil and housing.

Referring to FIG. 5, an example of another evaporative fluid cooling apparatus 12(2) is illustrated. The evaporative fluid cooling apparatus 12(2) is the same in structure and operation as the evaporative fluid cooling apparatus 12(1), except as illustrated and described herein. Elements in the evaporative fluid cooling apparatus 12(2) which are like those in evaporative fluid cooling apparatus 12(1) have like reference numerals.

In this example, the housing 14 in the evaporative fluid cooling apparatus 12(2) includes a moveable barrier 100 which may be adjustably positioned in the housing 14 to divide a portion of the cooling chamber 17 into two separate regions which permit air flow between the air input 23 and the air output 25, although the cooling chamber 17 can be divided in other manners and other proportions. The fluid coil 16(1) in the evaporative fluid cooling apparatus 12(2) comprises two separate fluid coils 16(1a) and 16(1b) which are coupled in series with each of the fluid 16(1a) and 16(1b) positioned to extend across at least a portion of one of the regions in the cooling chamber 17, although the fluid coil 16(1) may comprises other numbers of fluid coils in other configurations. The air movement device 22 comprises two separate air movement device 22(a) and 22(b) which are each positioned adjacent the air output 25 in one of the regions in the cooling chamber 17, although the air movement device 22 may comprises other numbers of air movement devices in other configurations and locations. The two separate air movement device 22(a) and 22(b) may each be controlled separately by the evaporative cooler computing device 60 to generate a flow of air through the cooling chamber 17 from the one or more air inputs 23 through the cooling chamber 17 and out the air output 25, although the air movement device 22(a) and 22(b) may each be controlled in other manners. One of the controllable vents or louvers 26 is positioned in the housing 14 to provide controlled access to one of the regions in the cooling chamber 17, although other types and/or numbers of controllable vents or louvres could be used. The sprayer apparatus 20 in the evaporative fluid cooling apparatus 12(2) may be controlled by the evaporative cooler computing device 60 based on at least one characteristic, such as outside air temperature by way of example only, to spray in only one of the regions in the cooling chamber 17 on the outlet side to supply the cooled fluid back to heat exchanger 28 in the air handler 32, although the sprayer apparatus 20 could be configured to spray in the regions in the cooling chamber 17 in other manners and/or patterns.

As noted earlier, the operation of the evaporative fluid cooling apparatus 12(2) is the same as described earlier with reference to the evaporative fluid cooling apparatus 12(1), except in this example separate top coils, a center divider and separate exhaust fans allow for more precise control over the cooling operation. As a result, this advantageously provides substantial water savings as it will require less water to achieve the same cooling, as well as reasonable other cost savings.

Referring to FIG. 6 an example of another evaporative fluid cooling apparatus 12(3) is illustrated. The evaporative fluid cooling apparatus 12(3) is the same in structure and operation as the evaporative fluid cooling apparatuses 12(1) and 12(2), except as illustrated and described herein. Elements in the evaporative fluid cooling apparatus 12(3) which are like those in evaporative fluid cooling apparatuses 12(1) and 12(2) have like reference numerals.

In this example, the housing 14 in the evaporative fluid cooling apparatus 12(3) includes a moveable barrier 100 which may be adjustably positioned in the housing 14 to divide the cooling chamber 17 into two separate regions and which permit air flow between the air input 23 and the air output 25, although the cooling chamber 17 can be divided in other manners and other proportions. The fluid coil 16(1) in the evaporative fluid cooling apparatus 12(3) comprises two separate fluid coils 16(1a) and 16(1b) which are coupled in series with each of the fluid 16(1a) and 16(1b) positioned to extend across at least a portion of one of the regions in the cooling chamber 17, although the fluid coil 16(1) may comprises other numbers of fluid coils in other configurations. The fluid coil 16(2) in the evaporative fluid cooling apparatus 12(3) comprises two separate fluid coils 16(2a) and 16(2b) which are coupled in series with each of the fluid 16(2a) and 16(2b) positioned to extend across at least a portion of one of the regions in the cooling chamber 17, although the fluid coil 16(2) may comprises other numbers of fluid coils in other configurations. In this example, the output from the fluid coil 16(1b) is coupled to the input of fluid coil (2a) so that fluid coils 16(1a), 16(1b), 16(2a), and 16(2b) are coupled in series and in this example form a "Z" shape The air movement device 22 comprises two separate air movement device 22(a) and 22(b) which are each positioned adjacent the air output 25 in one of the regions in the cooling chamber 17, although the air movement device 22 may comprises other numbers of air movement devices in other configurations and locations. The two separate air movement device 22(a) and 22(b) may each be controlled separately by the evaporative cooler computing device 60 based on at least one characteristic, such as outside air temperature by way of example only, to generate a flow of air through the cooling chamber 17 from the one or more air inputs 23 through the cooling chamber 17 and out the air output 25, although the air movement devices 22(a) and 22(b) may each be controlled in other manners. One of the controllable vents or louvers 26 is positioned in the housing 14 to provide controlled access to one of the regions in the cooling chamber 17, although other types and/or numbers of controllable vents or louvres could be used. The sprayer apparatus 20 in the evaporative fluid cooling apparatus 12(2) may be controlled by the evaporative cooler computing device 60 based on at least one characteristic, such as outside air temperature by way of example only, to spray in only one of the regions in the cooling chamber 17 on the outlet side to supply the cooled fluid back to heat exchanger 28 in the air handler 32, although the sprayer apparatus 20 could be configured to spray in the regions in the cooling chamber 17 in other manners and/or patterns.

As noted earlier, the operation of the evaporative fluid cooling apparatus 12(3) is the same as described earlier with reference to the evaporative fluid cooling apparatus 12(1), except in this example separate top and bottom coils, a center divider and separate exhaust fans allow for even more precise control over the cooling operation than in previous examples. In 12(3) the separation into two separate airflow sides allows warmer air to move on the left in the example (the right side top fluid coil 16(1b) feeds fluid to the left side bottom fluid coil 16(2a) so the warmer top and bottom fluid coils 16(1a) and 16(2a) are on the left, cooler fluid coils 16(1b) and 16(2b) on the right, creating a "Z" type arrangement of fluid movement) and cooler air on the right, at air flow generated by air movement devices 22(a) and 22(b) and sprayer rates provided by the sprayer apparatus 20 which are each individually managed and controlled by the evaporative cooler management computing device 60 to maximize efficiency, allowing very precise control over the operation of the tower. As a result, this advantageously provides even greater water savings with evaporative fluid cooling apparatus 12(3) than with evaporative fluid cooling apparatus 12(2) example, providing substantial water savings over standard designs, while further reducing other costs, all in savings should well exceed 5% over the evaporative fluid cooling apparatus 12(3) in many environments.

Accordingly, as illustrated and described by way of reference to the examples herein, this technology provides more effective and efficient evaporative fluid cooling apparatuses and methods. This technology slows the GPM, thus allowing for substantially more time for heat to be absorbed.

With lower GPM, the power used by the pumps decreases almost geometrically and the wear on the pumps decreases substantially. Additionally, with lower GPM much warmer water is sent to the evaporative fluid cooling apparatus which means more will be released into the atmosphere on the same amount of metal (cooling surface) since it is both hotter and moving more slowly to allow more 'time on metal' or time for the metal to be able to transfer the heat to the air. Since the metal is warmer from the warmer water, everything is more efficient due to the higher temperature differential to the atmosphere and operates the chiller in a much more favorable delta, thus the chiller is operating at a lower effective tonnage due to the more efficient heat transfer to the atmosphere noted above.

Having thus described the basic concept of this technology, it will be rather apparent to those skilled in the art that the foregoing detailed disclosure is intended to be presented by way of example only, and is not limiting. Various alterations, improvements, and modifications will occur and are intended to those skilled in the art, though not expressly stated herein. These alterations, improvements, and modifications are intended to be suggested hereby, and are within the spirit and scope of this technology. Additionally, the recited order of processing elements or sequences, or the use of numbers, letters, or other designations therefore, is not intended to limit the claimed processes to any order except as may be specified in the claims. Accordingly, this technology is limited only by the following claims and equivalents thereto.

What is claimed is:

1. An evaporative fluid cooling apparatus comprising:
   a cooling chamber with an air housing input and an air housing output;
   at least two fluid coils positioned in and extending across at least a portion of the cooling chamber in a spaced apart stacked arrangement, one of the fluid coils positioned closer to the air housing output having a first fluid input configured to be coupled to a fluid return from one or more air handler devices and a first fluid output coupled to a second fluid input to the other one of the fluid coils that is positioned closer to the air housing input with the other one of the fluid coils having a second fluid output configured to be coupled to a fluid supply to the one or more air handler devices; and
   an air flow device positioned to provide air flow through the cooling chamber when activated.

2. The apparatus as set forth in claim 1 further comprising one or more spray apparatuses positioned and configured to spray a fluid on at least one of the at least two fluid coils when activated.

3. The apparatus as set forth in claim 2 wherein the one or more spray apparatuses further comprise:
   a collection device positioned to capture the fluid sprayed by the one or more spray apparatuses; and
   a pump configured to supply the fluid in the collection device to the one or more spray apparatuses.

4. The apparatus as set forth in claim 1 further comprising:
   a compressor chiller having a first compressor chiller output coupled to the first fluid input of the one of the fluid coils and a second compressor chiller output configured to be coupled to the fluid supply to the one or more air handler devices;
   at least one temperature monitoring device that is configured to monitor a temperature of a fluid at the second fluid output of the other one of the fluid coils;
   a first coil diverter valve apparatus having an input coupled to the first fluid output of the one of the fluid coils, one output coupled to the second fluid input to the other one of the fluid coils, and another output coupled to a first compressor chiller input of the compressor chiller; and
   a second coil diverter valve apparatus having an input coupled to the first fluid output of the other one of the fluid coils, one output configured to be coupled to the fluid supply to the one or more air handler device, and another output coupled to a second compressor chiller input of the compressor chiller.

5. The apparatus as set forth in claim 4 further comprising:
   an evaporative cooler management computing device coupled to at least the temperature monitoring device and the compressor chiller:
      wherein the evaporative cooler management computing device comprises a memory coupled to at least one processor which is configured to be capable of executing programmed instructions comprising and stored in the memory to:
      determine when a monitored temperature of the fluid at the second fluid output of the other one of the fluid coils exceeds a first stored threshold temperature; and
      engage the compressor chiller to provide additional cooling of at least a portion of the fluid at the second fluid output of the other one of the fluid coils when the monitored temperature is determined to exceed the first stored threshold temperature.

6. The apparatus as set forth in claim 5 wherein the first stored threshold temperature comprises a wet bulb temperature of at least 60 degrees or an ambient temperature of at least 80 degrees.

7. The apparatus as set forth in claim 5 wherein the evaporative cooler management computing device is further coupled to at least the first coil diverter valve apparatus and the second coil diverter valve apparatus and wherein the processor is configured to be capable of executing one or more additional programmed instructions comprising and stored in the memory to:
   engage the first coil diverter valve apparatus to divert at least a portion of the fluid at the another output to the compressor chiller when the monitored temperature is determined to exceed the first stored threshold temperature; and
   engage the second coil diverter valve apparatus to divert at least a portion of the fluid at the second fluid output of the other one of the fluid coils to the compressor chiller when the monitored temperature is determined to exceed the first stored threshold temperature.

8. The apparatus as set forth in claim 7 wherein the processor is further configured to be capable of executing one or more additional programmed instructions for the instruction to engage the compressor chiller to provide additional cooling that comprise and are stored in the memory to:
   determine an amount the monitored temperature exceeds a first stored threshold temperature; and
   adjust the engagement of one or more of the compressor chiller, the first coil diverter valve apparatus, and the first coil diverter valve apparatus based on the determined amount the monitored temperature exceeds the first stored threshold temperature.

9. The apparatus as set forth in claim 7 further comprising:
   at least one refrigerant coil positioned in and extending across at least a portion of the cooling chamber, the at least one refrigerant coil having a first refrigerant fluid input configured to be coupled to a fluid return from a refrigerant system and a first refrigerant fluid output configured to be coupled to a fluid supply to the refrigerant system; and at least one refrigerant pump configured and coupled to pump refrigerant through the at least one refrigerant coil;

wherein the processor is further configured to be capable of executing one or more additional programmed instructions that comprise and are stored in the memory to:

determine when the monitored temperature of the fluid at the second fluid output of the other one of the fluid coils exceeds a second stored threshold temperature; and engage the at least one refrigerant pump to pump refrigerant through the at least one refrigerant coil when the monitored temperature is determined to exceed the second stored threshold temperature.

10. The apparatus as set forth in claim 9 wherein the at least one refrigerant pump further comprises a frictionless pump.

11. The apparatus as set forth in claim 5 further comprising a cooling housing that defines a cooling chamber, the cooling housing further comprising:

one or more controllable vents positioned at least between the at least two fluid coils; and wherein the processor is further configured to be capable of executing one or more additional programmed instructions that comprise and are stored in the memory to:

determine when a monitored temperature of the fluid at the second fluid output of the other one of the fluid coils exceeds a third stored threshold temperature; and engage one or more of the controllable vents to move to at least a partially open position to provide additional air flow into the cooling chamber when the monitored temperature is determined to exceed the third stored threshold temperature.

12. The apparatus as set forth in claim 1 further comprising an adjustable barrier positioned in the cooling housing that divides at least a portion of the cooling chamber into at least two regions;

wherein at least one of the fluid coils further comprises at least two separate fluid coils coupled in series, each of the at least two separate fluid coils positioned in and extending across at least a portion of one of the regions in the cooling chamber, one of the at least two separate fluid coils has a first fluid input configured to be coupled to a fluid return from the one or more air handler devices and the other one of the at least two separate fluid coils has a first fluid output coupled to a second fluid input to the other one of the fluid coils; and wherein the air flow device further comprises at least two separate air flow devices each positioned in one of the regions in the cooling chamber to provide air flow from the air housing input through the cooling chamber and out the air housing output when activated.

13. The apparatus as set forth in claim 12 further comprising an evaporative cooler management computing device that comprises a memory coupled to at least one processor which is configured to be capable of executing programmed instructions comprising and stored in the memory to:

control activation and a rate of operation of the at least two separate air flow devices and of the one or more spray apparatuses based on at least one characteristic.

14. The apparatus as set forth in claim 12 wherein the at least the other one of the fluid coils further comprises at least two additional separate fluid coils coupled in series, each of the at least two additional separate fluid coils positioned in and extending across at least a portion of one of the regions in the cooling chamber, one of the at least additional two separate fluid coils has a second fluid input coupled to the first fluid output of the other one of the at least two separate fluid coils and a second fluid output configured to be coupled to a fluid supply to the one or more air handler devices.

15. A method for making an evaporative fluid cooling apparatus, the method comprising:

providing a cooling chamber with an air housing input and an air housing output;

positioning at least two fluid coils to extend across at least a portion of the cooling chamber in a spaced apart stacked arrangement, one of the fluid coils positioned closer to the air housing output having a first fluid input configured to be coupled to a fluid return from one or more air handler devices and a first fluid output coupled to a second fluid input to the other one of the fluid coils that is positioned closer to the air housing input with the other one of the fluid coils having a second fluid output configured to be coupled to a fluid supply to the one or more air handler devices; and positioning an air flow device to provide air flow through the cooling chamber when activated.

16. The method as set forth in claim 15 further comprising positioning one or more spray apparatuses configured to spray a fluid on at least one of the at least two fluid coils when activated.

17. The method as set forth in claim 16 wherein the positioning the one or more spray apparatuses further comprise:

positioning a collection device to capture the fluid sprayed by the one or more spray devices; and providing a pump configured to supply the fluid in the collection device to the one or more spray apparatuses.

18. The method as set forth in claim 15 further comprising:

providing a compressor chiller having a first compressor chiller output coupled to the first fluid input of the one of the fluid coils and a second compressor chiller output configured to be coupled to the fluid supply to the one or more air handler devices;

providing at least one temperature monitoring device that is configured to monitor a temperature of a fluid at the second fluid output of the other one of the fluid coils;

providing a first coil diverter valve apparatus having an input coupled to the first fluid output of the one of the fluid coils, one output coupled to the second fluid input to the other one of the fluid coils, and another output coupled to a first compressor chiller input of the compressor chiller; and providing a second coil diverter valve apparatus having an input coupled to the first fluid output of the other one of the fluid coils, one output configured to be coupled to the fluid supply to the one or more air handler device, and another output coupled to a second compressor chiller input of the compressor chiller.

19. The method as set forth in claim 18 further comprising:
coupling an evaporative cooler management computing device to at least the temperature monitoring device and the compressor chiller;
wherein the evaporative cooler management computing device comprises a memory coupled to at least one processor which is configured to be capable of executing programmed instructions comprising and stored in the memory to:
determine when a monitored temperature of the fluid at the second fluid output of the other one of the fluid coils exceeds a first stored threshold temperature; and
engage the compressor chiller to provide additional cooling of at least a portion of the fluid at the second fluid output of the other one of the fluid coils when the monitored temperature is determined to exceed the first stored threshold temperature.

20. The method as set forth in claim 19 wherein the first stored threshold temperature comprises a wet bulb temperature of at least 60 degrees or an ambient temperature of at least 80 degrees.

21. The method as set forth in claim 19 further comprising:
coupling the evaporative cooler management computing device to at least the first coil diverter valve apparatus and the second coil diverter valve apparatus;
wherein the processor is configured to be capable of executing one or more additional programmed instructions comprising and stored in the memory to:
engage the first coil diverter valve apparatus to divert at least a portion of the fluid at the another output to the compressor chiller when the monitored temperature is determined to exceed the first stored threshold temperature; and
engage the second coil diverter valve apparatus to divert at least a portion of the fluid at the second fluid output of the other one of the fluid coils to the compressor chiller when the monitored temperature is determined to exceed the first stored threshold temperature.

22. The method as set forth in claim 21 wherein the processor is further configured to be capable of executing one or more additional programmed instructions for the instruction to engage the compressor chiller to provide additional cooling that comprise and are stored in the memory to:
determine an amount the monitored temperature exceeds a first stored threshold temperature; and
adjust the engagement of one or more of the compressor chiller, the first coil diverter valve apparatus, and the first coil diverter valve apparatus based on the determined amount the monitored temperature exceeds the first stored threshold temperature.

23. The method as set forth in claim 21 further comprising:
positioning at least one refrigerant coil to extend across at least a portion of the cooling chamber, the at least one refrigerant coil having a first refrigerant fluid input configured to be coupled to a fluid return from a refrigerant system and a first refrigerant fluid output configured to be coupled to a fluid supply to the refrigerant system;
coupling at least one refrigerant pump to the at least one refrigerant coil, the at least one refrigerant pump configured to pump refrigerant through the at least one refrigerant coil when engaged;
wherein the processor is further configured to be capable of executing one or more additional programmed instructions that comprise and are stored in the memory to:
determine when the monitored temperature of the fluid at the second fluid output of the other one of the fluid coils exceeds a second stored threshold temperature; and
engage the at least one refrigerant pump to pump refrigerant through the at least one refrigerant coil when the monitored temperature is determined to exceed the second stored threshold temperature.

24. The method as set forth in claim 19 wherein the providing the cooling housing further comprises:
positioning one or more controllable vents adjacent at least between the at least two fluid coils; and
wherein the processor is further configured to be capable of executing one or more additional programmed instructions that comprise and are stored in the memory to:
determine when a monitored temperature of the fluid at the second fluid output of the other one of the fluid coils exceeds a third stored threshold temperature; and
engage one or more of the controllable vents to move to at least a partially open position to provide additional air flow into the cooling chamber when the monitored temperature is determined to exceed the third stored threshold temperature.

25. The method as set forth in claim 24 wherein the at least other one of the fluid coils further comprises at least two additional separate fluid coils coupled in series, each of the at least two additional separate fluid coils positioned in and extending across at least a portion of one of the regions in the cooling chamber, one of the at least additional two separate fluid coils has a second fluid input coupled to the first fluid output of the other one of the at least two separate fluid coils and a second fluid output configured to be coupled to a fluid supply to the one or more air handler devices.

26. The method as set forth in claim 15 wherein the at least one refrigerant pump further comprises a frictionless pump.

27. The method as set forth in claim 15 further comprising positioning an adjustable barrier in the cooling housing that divides at least a portion of the cooling chamber into at least two regions;
wherein at least one of the fluid coils further comprises at least two separate fluid coils coupled in series, each of the at least two separate fluid coils positioned in and extending across at least a portion of one of the regions in the cooling chamber, one of the at least two separate fluid coils has a first fluid input configured to be coupled to a fluid return from the one or more air handler devices and the other one of the at least two separate fluid coils has a first fluid output coupled to a second fluid input to the other one of the fluid coils; and
wherein the air flow device further comprises at least two separate air flow devices each positioned in one of the regions in the cooling chamber to provide air flow from the air housing input through the cooling chamber and out the air housing output when activated.

28. The method as set forth in claim 27 further comprising providing an evaporative cooler management computing device that comprises a memory coupled to at least one processor which is configured to be capable of executing programmed instructions comprising and stored in the memory to:
  control activation and a rate of operation of the at least two separate air flow devices and of the one or more spray apparatuses based on at least one characteristic.

* * * * *